US012565702B2

(12) United States Patent
Jiang et al.

(10) Patent No.: US 12,565,702 B2
(45) Date of Patent: Mar. 3, 2026

(54) METHOD OF SELECTIVE METAL DEPOSITION USING SEPARATED REACTANT ACTIVATION AND PLASMA DISCHARGING ZONE

(71) Applicant: Applied Materials, Inc., Santa Clara, CA (US)

(72) Inventors: Ying-Bing Jiang, San Jose, CA (US); Joung Joo Lee, San Jose, CA (US); Xianmin Tang, San Jose, CA (US); Jiang Lu, Milpitas, CA (US); Avgerinos V. Gelatos, Scotts Valley, CA (US); Dien-yeh Wu, San Jose, CA (US); Weifeng Ye, San Jose, CA (US); Yiyang Wan, Sunnyvale, CA (US); Gary How, Sunnyvale, CA (US); Joseph Hernandez, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 542 days.

(21) Appl. No.: 18/078,841

(22) Filed: Dec. 9, 2022

(65) Prior Publication Data

US 2024/0191354 A1 Jun. 13, 2024

(51) Int. Cl.
*C23C 16/455* (2006.01)
*C23C 16/42* (2006.01)
(Continued)

(52) U.S. Cl.
CPC ........ *C23C 16/45536* (2013.01); *C23C 16/42* (2013.01); *C23C 16/45553* (2013.01);
(Continued)

(58) Field of Classification Search
CPC ............. C23C 16/45536; C23C 16/42; C23C 16/45553; C23C 16/45565; C23C 16/505;
(Continued)

(56) References Cited

U.S. PATENT DOCUMENTS 6,302,964 B1 10/2001 Umotoy et al.
6,499,425 B1 * 12/2002 Sandhu ............. C23C 16/45574
156/345.44
(Continued)

FOREIGN PATENT DOCUMENTS

KR 20210115861 A * 9/2021

OTHER PUBLICATIONS

Machine Translation KR-20210115861 (Year: 2021).*
International Search Report for PCT/US2023/035841, dated Feb. 16, 2024.

*Primary Examiner* — Rodney G Mcdonald
(74) *Attorney, Agent, or Firm* — Moser Taboada

(57) ABSTRACT

Methods of depositing a metal silicide on a substrate are provided herein. In some embodiments, a method of depositing a metal silicide on a substrate having a silicon containing surface includes: creating a plasma comprising a first gas in a plasma region in a chemical vapor deposition (CVD) chamber, wherein the plasma region is disposed between a lid heater and a showerhead; flowing the first gas through a plurality of first openings of the showerhead to an activation region in the CVD chamber disposed between the showerhead and the substrate; flowing a second gas comprising a metal precursor in a non-plasma state through a plurality of second openings of the showerhead to the activation region, wherein the plurality of second openings are fluidly independent from the plurality of first openings within the showerhead; mixing the first gas with the second gas to activate the second gas in the activation region; and expos-
(Continued)

ing the silicon containing surface of the substrate to the activated second gas.

20 Claims, 4 Drawing Sheets

(51) Int. Cl.
  *C23C 16/505* (2006.01)
  *H01J 37/32* (2006.01)
(52) U.S. Cl.
  CPC ...... *C23C 16/45565* (2013.01); *C23C 16/505* (2013.01); *H01J 37/321* (2013.01); *H01J 2237/3321* (2013.01)
(58) Field of Classification Search
  CPC ................. H01J 37/321; H01J 37/3244; H01J 37/32449; H01J 2237/332

USPC ........................................... 427/248.1–255.7
See application file for complete search history.

(56) References Cited

U.S. PATENT DOCUMENTS

| | | | |
|---|---|---|---|
| 7,779,784 B2 | 8/2010 | Chen et al. | |
| 2001/0015261 A1 | 8/2001 | Kobayashi et al. | |
| 2006/0225655 A1* | 10/2006 | Faguet | C23C 16/5096 |
| | | | 118/723 R |
| 2007/0015360 A1 | 1/2007 | Lu et al. | |
| 2011/0265721 A1* | 11/2011 | Kao | H01J 37/3244 |
| | | | 422/186.04 |
| 2016/0276140 A1 | 9/2016 | Varadarajan et al. | |
| 2018/0286696 A1 | 10/2018 | Ogawa et al. | |
| 2020/0211852 A1* | 7/2020 | Kuratomi | C23C 16/5096 |
| 2021/0287877 A1 | 9/2021 | Kim et al. | |

* cited by examiner

METHOD OF SELECTIVE METAL DEPOSITION USING SEPARATED REACTANT ACTIVATION AND PLASMA DISCHARGING ZONE

FIELD

Embodiments of the present disclosure generally relate to methods of processing a substrate, and more specifically, selective metal deposition on a substrate.

BACKGROUND

Metal silicides are typically formed during the processing of semiconductor substrates in the formation of integrated circuits, for example, in the source/drain contact regions to reduce contact resistance. In a conventional CVD metal silicide deposition process, a metal precursor is mixed with carrier gas to generate a metal precursor containing plasma. However, such a plasma may be corrosive and challenging for hardware reliability. For example, the metal precursor containing plasma may be a PECVD plasma that leads to unwanted deposition on chamber walls, causes particle issues, and leads to non-controllable activation of the metal precursor containing plasma. The unwanted deposition and particle issues necessitate more process chamber downtime for servicing or cleaning of the hardware.

Accordingly, the inventors have provided herein embodiments of improved methods of depositing a metal silicide on a substrate.

SUMMARY

Methods of depositing a metal silicide on a substrate are provided herein. In some embodiments, a method of depositing a metal silicide on a substrate having a silicon containing surface includes: creating a plasma comprising a first gas in a plasma region in a chemical vapor deposition (CVD) chamber, wherein the plasma region is disposed between a lid heater and a showerhead; flowing the first gas through a plurality of first openings of the showerhead to an activation region in the CVD chamber disposed between the showerhead and the substrate; flowing a second gas comprising a metal precursor in a non-plasma state through a plurality of second openings of the showerhead to the activation region, wherein the plurality of second openings are fluidly independent from the plurality of first openings within the showerhead; mixing the first gas with the second gas to activate the second gas in the activation region; and exposing the silicon containing surface of the substrate to the activated second gas.

In some embodiments, a method of depositing titanium silicide on a substrate, includes: creating a plasma comprising a first gas including argon gas in a plasma region in a chemical vapor deposition (CVD) chamber, wherein the plasma region is disposed between a lid heater and a showerhead; flowing the first gas through a plurality of first openings of the showerhead to an activation region in the CVD chamber disposed between the showerhead and the substrate; flowing a second gas comprising a titanium precursor in a non-plasma state through a plurality of second openings of the showerhead to the activation region, wherein the plurality of second openings are fluidly independent from the plurality of first openings within the showerhead; mixing the first gas with the second gas to activate the second gas in the activation region to form radicals of the titanium precursor; and exposing a silicon surface of the substrate to the radicals of the titanium precursor to deposit titanium silicide on the substrate.

In some embodiments, a method of depositing titanium silicide on a substrate includes: applying RF power to a showerhead or lid heater in a chemical vapor deposition (CVD) chamber; flowing a first gas including argon gas and hydrogen gas in a plasma region disposed between the lid heater and the showerhead to form a plasma comprising the first gas; flowing the first gas through a plurality of first openings of the showerhead to an activation region in the CVD chamber disposed between the showerhead and the substrate; flowing a second gas comprising titanium tetrachloride ($TiCl_4$) in a non-plasma state through a plurality of second openings of the showerhead to the activation region, wherein the plurality of second openings are fluidly independent from the plurality of first openings within the showerhead; mixing the first gas with the second gas to activate the second gas in the activation region to form titanium trichloride ($TiCl_3$) radicals, wherein a pressure in the activation region is between about 2 to about 10 Torr; and exposing the $TiCl_3$ radicals to the substrate to form titanium silicide on the substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
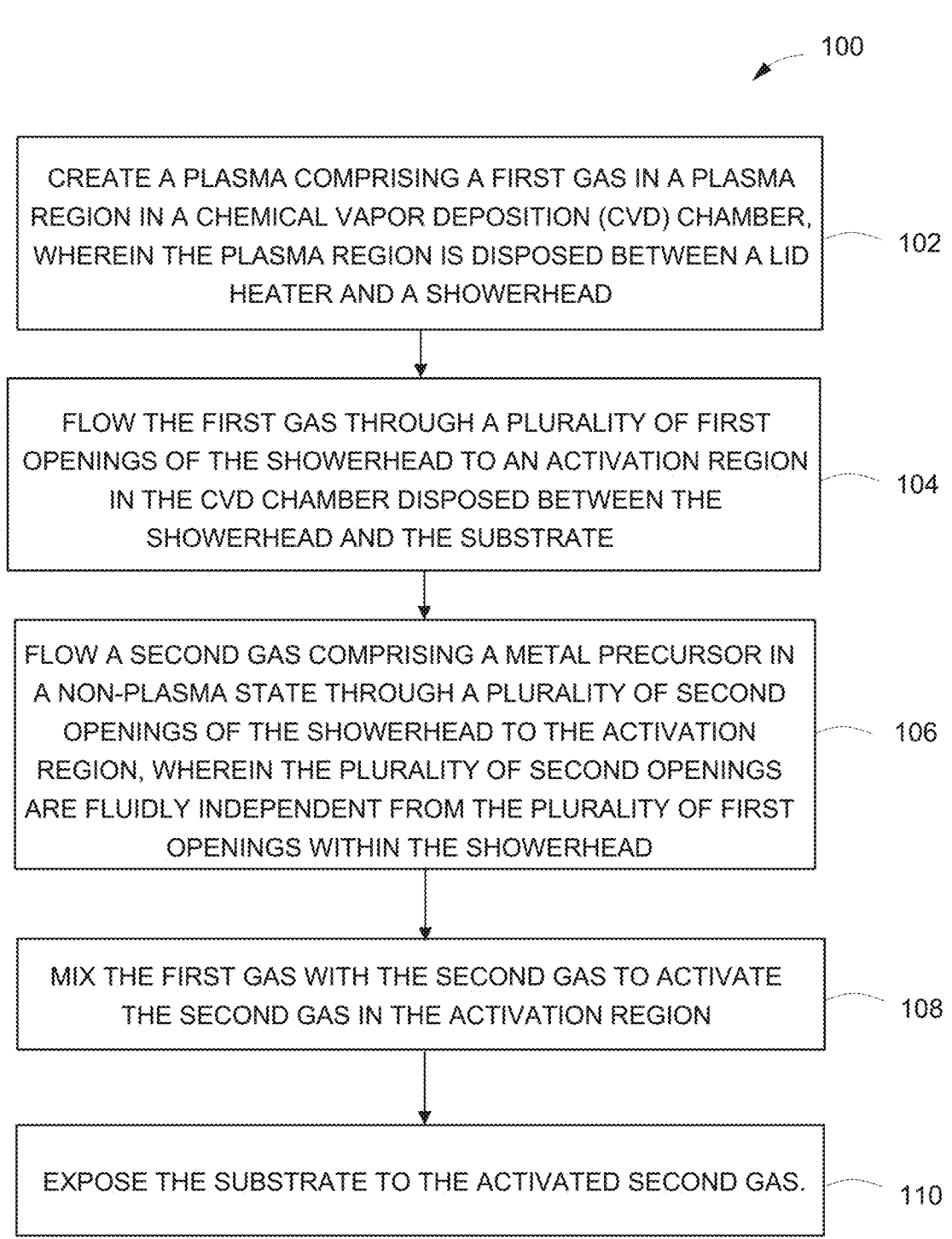
FIG. 1 depicts a flow chart of a method of depositing a metal silicide on a substrate in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods of depositing, or forming, a metal silicide on a substrate are provided herein. The methods includes separating a plasma region from an activation region via a dual channel showerhead in a chemical vapor deposition (CVD) chamber. A plasma comprising one or more non-deposition gases, or carrier gases, are formed in the plasma region. A precursor, for example a metal precursor such as a metal halide, disposed within an active plasma and high temperature environment leads to the formation of corrosive secondary, tertiary, etc. dissociation. Thus, the methods provided herein advantageously include flowing the metal precursor in a non-plasma state directly into the non-plasma activation region and preventing the metal precursor from entering the plasma region, greatly reducing the formation of corrosive chlorine chemistry. The metal precursor mixes with the one or more carrier gases in the activation region to activate the metal precursor for the formation of metal silicide on a silicon containing substrate.

FIG. 1 depicts a flow chart of a method 100 of depositing a metal silicide on a substrate in accordance with at least some embodiments of the present disclosure. The method 100, at 102, includes creating a plasma (e.g., plasma 250) comprising a first gas in a plasma region (e.g., plasma region 206) in a chemical vapor deposition (CVD) chamber (e.g., process chamber 200). The plasma region is disposed between a lid heater (e.g., lid heater 232) and a showerhead (e.g., showerhead 226). In some embodiments, the plasma is an inductively coupled plasma. In some embodiments, the plasma is a capacitively coupled plasma. In some embodiments, the method 100 includes maintaining the lid heater at a temperature of about 300 to about 600 degrees Celsius.

In some embodiments, the method 100 includes applying RF power to the lid heater or the showerhead (e.g., showerhead 226) to create an electric field in the plasma region to facilitate generating the plasma. In some embodiments, the method 100 includes maintaining the showerhead temperature at about 300 to about 500 degrees Celsius. In some embodiments, the first gas (e.g., first gas 340) comprises one or more of a noble gas (e.g., argon gas, helium gas), nitrogen gas, hydrogen gas, or ammonia. In some embodiments, the first gas comprises argon gas and hydrogen gas. In some embodiments, a ratio of argon gas to hydrogen gas in the first gas is about 3.5 to about 4.5 by volume. In some embodiments, the first gas creates a gas curtain that substantially prevents the precursor from entering the plasma region. In some embodiments, the method 100 includes grounding a substrate support (e.g., substrate support 236) on which a substrate (e.g., substrate 210). In some embodiments, the first gas is pulsed through the plurality of first openings 224.

In some embodiments, the electric field does not extend to the activation region. At 104, the method 100 includes flowing the first gas through a plurality of first openings (e.g., plurality of first openings 224) of the showerhead to an activation region (e.g., activation region 208) in the CVD chamber disposed between the showerhead and the substrate. In some embodiments, the plurality of first openings have a diameter of about 20 to about 200 mils. The plurality of first openings may be sized such that the plasma may slightly leak through the plurality of first openings.

At 106, the method 100 includes flowing a second gas (e.g., second gas 350) comprising a metal precursor in a non-plasma state through a plurality of second openings (e.g., plurality of second openings 312) of the showerhead to the activation region, wherein the plurality of second openings are fluidly independent from the plurality of first openings within the showerhead. In some embodiments, the precursor comprises a metal precursor, for example, a metal halide such as titanium tetrachloride ($TiCl_4$) or molybdenum pentachloride ($MoCl_5$). In some embodiments, the second gas includes a metal precursor and argon gas. In some embodiments, the second gas is not exposed to the plasma region 206.

At 108, the method 100 includes mixing the first gas with the second gas to activate the second gas in the activation region. For example, mixing the first gas with the second gas to activate the second gas in the activation region comprises forming titanium trichloride ($TiCl_3$) radicals. In some embodiments, a pressure in the activation region is between about 2 to about 10 Torr, for example, about 3 to about 6 Torr. At 110, the method 100 includes exposing the substrate to the activated second gas. For example, the substrate may be a silicon substrate or have a silicon surface and the activated second gas comprises titanium trichloride ($TiCl_3$) radicals of a titanium precursor that when come into contact with the silicon surface, selectively deposit or form titanium silicide on the substrate.

Figure 2:
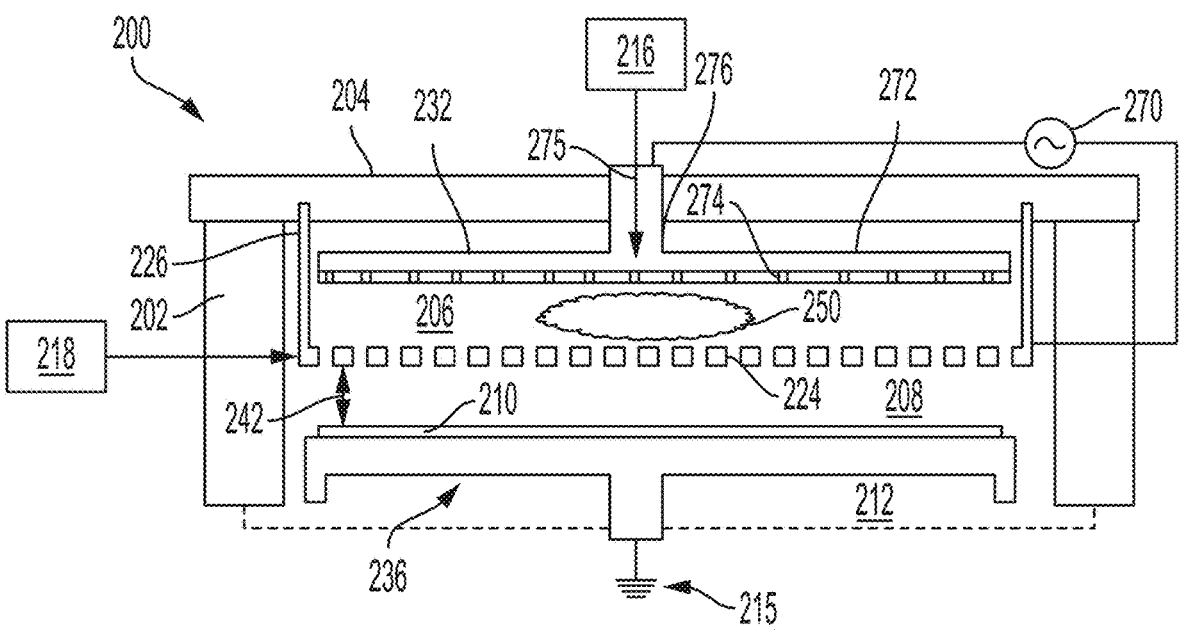
FIG. 2 depicts a schematic side view of a process chamber in accordance with at least some embodiments of the present disclosure.

FIG. 2 depicts a schematic side view of a process chamber 200 in accordance with at least some embodiments of the present disclosure. As depicted in FIG. 2, the process chamber 200 is a CVD chamber, however, the methods provided herein may be used with other types of deposition chambers. The process chamber 200 generally comprises a chamber body 202 having a top plate 204 disposed thereon to define an interior volume 212. A lid heater 232 is coupled to the top plate 204 and disposed in the interior volume 212. A substrate support 236 is disposed in the interior volume 212 opposite the lid heater 232. The substrate support 236 may be coupled to ground 215. The substrate support 236 includes a support surface for supporting a substrate 210. A showerhead 226 having dual channels is disposed in the interior volume 212 between the lid heater 232 and the substrate support 236. The lid heater 232 and the showerhead 226 define a plasma region 206 therebetween. The showerhead 226 and the substrate support 236 define an activation region 208 therebetween. In some embodiments, a distance 242 between the showerhead 226 and the substrate 210 is about 100 to about 300 mil.

An RF power supply 270 is coupled to the lid heater 232 or the showerhead 226 to create an electric field in the plasma region 206 to facilitate generating a plasma 250 therein. In some embodiments, the RF power supply 270 provides about 600 to about 1000 watts of RF power. A first gas source 216 containing a first gas is coupled to the lid heater 232. The lid heater 232 is configured for delivering the first gas to the plasma region 206. In some embodiments, the lid heater 232 includes resistive heating elements (not shown) configured to heater the lid heater 232 to a desired temperature (e.g., 400-500 Celsius).

In some embodiments, the lid heater 232 includes a flow path 275 therein for delivering the first gas to the plasma region 206 to be formed into the plasma 250. In some embodiments, the lid heater 232 includes a heater plate 272 coupled to a shaft 276. In some embodiments, the shaft 276 extends through the top plate 204. In some embodiments, the heater plate 272 includes a plurality of gas distribution openings 274. In some embodiments, a flow path for delivery of the first gas to the plasma region 206 extends outside of the heater plate 272 and around the heater plate 272.

In some embodiments, the showerhead 226 is coupled to the top plate 204. In some embodiments, the showerhead 226 is coupled to the top plate 204 at locations radially outward of the lid heater 232. The showerhead 226 generally includes a plurality of first openings 224 for delivering the plasma 250 comprising the first gas through the showerhead 226 and into the activation region 208. The showerhead is fluidly coupled to a precursor supply 218 having a second gas disposed therein. The precursor supply 218 is configured to deliver the second gas through a plurality of second openings 312 (described in more detail with respect to FIG. 3). The plurality of first openings 224 are fluidly independent from the plurality of second openings 312 in the showerhead 226 such that the first gas and the second gas do not mix in the showerhead 226.

Figure 3:
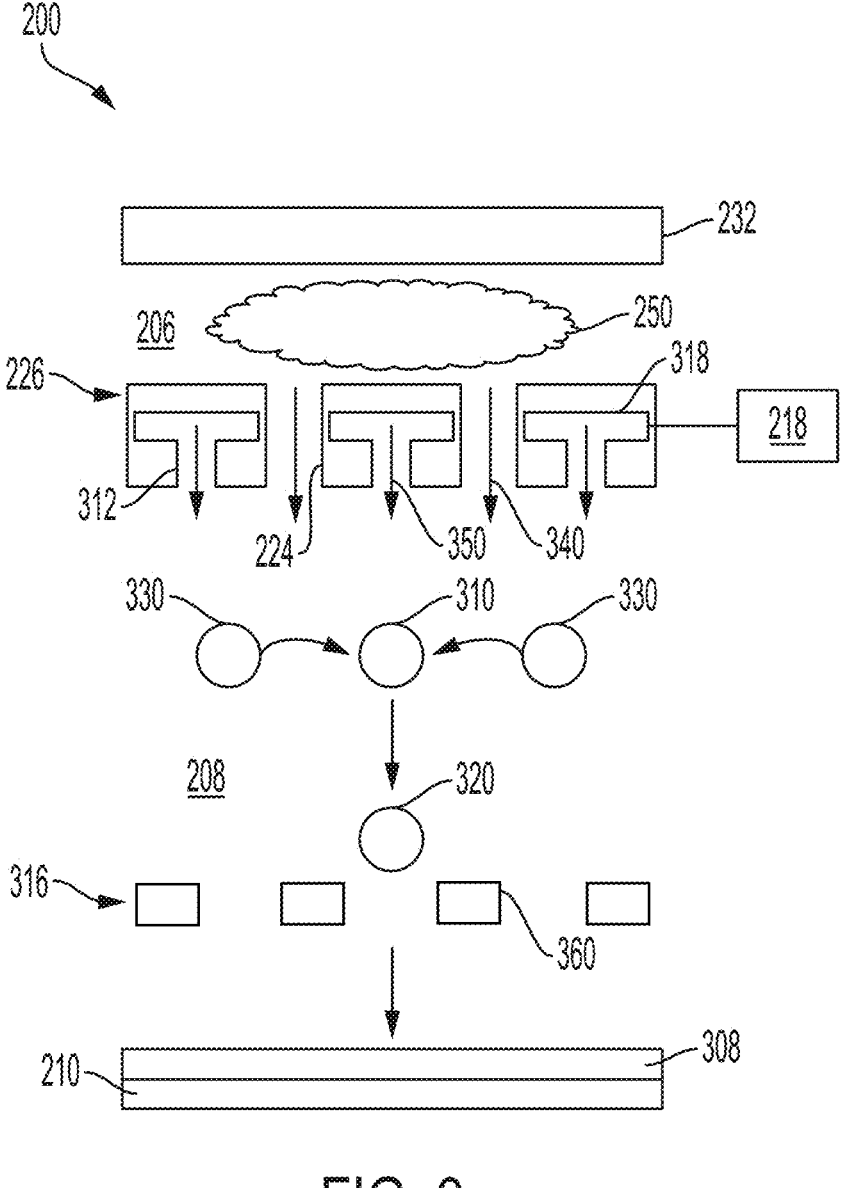
FIG. 3 depicts a schematic side view of a plasma region and an activation region of a process chamber in accordance with at least some embodiments of the present disclosure.

FIG. 3 depicts a schematic side view of a plasma region 206 and an activation region 208 of a process chamber in accordance with at least some embodiments of the present disclosure. In some embodiments, the showerhead 226 includes radial channels 318 fluidly independent from the plurality of first openings 224 and the plurality of second openings 312 extend from the radial channels 318 to deliver the second gas 350 to the activation region 208. The first gas 340 extends through the plurality of first openings 224 and mixes with the second gas 350 in the activation region 208 while creating a gas curtain reducing or preventing the second gas 350 from entering the plasma region 206. In the activation region 208, precursor particles 310 that comprise the second gas 350 are activated when mixed with the ions 330 that comprise the first gas 340. The ions 330, for example, may be argon or hydrogen ions. The precursor particles 310, when activated, form precursor radicals 320 that are configured to deposit or form a silicide 308 on the substrate 210.

In some embodiments, a second showerhead 316 is disposed between the showerhead 226 and the substrate 210. In some embodiments, the activation region 208 is disposed between the showerhead 226 and the second showerhead 316. The second showerhead 316 includes a plurality of third openings 360. The second showerhead 316 may advantageously choke gas flow, providing more opportunities for the precursor particles 310 to become activated, resulting in a larger concentration of the precursor radicals 320. The second showerhead 316 may also promote homogenization of the gases flowing onto the substrate 210 through the plurality of third openings 360.

Figure 4:
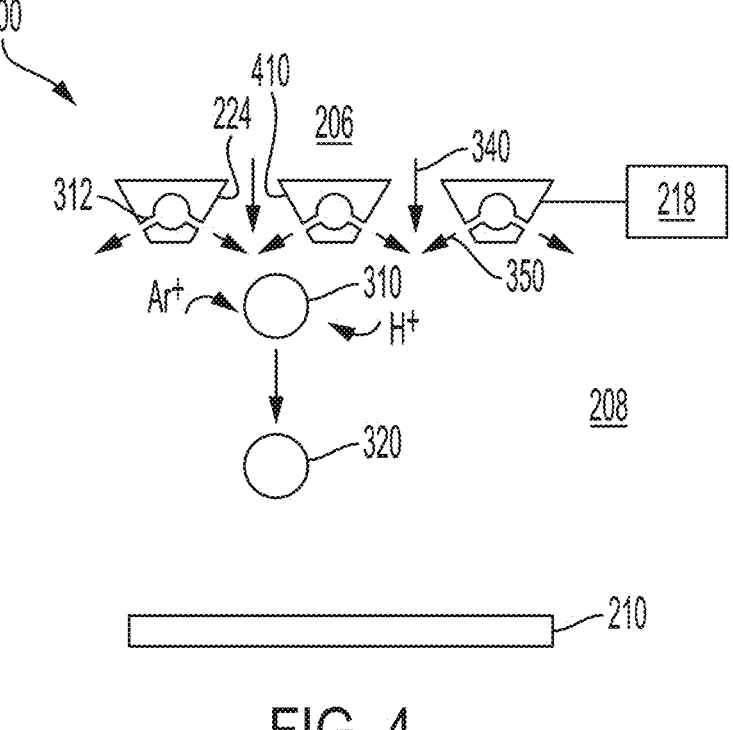
FIG. 4 depicts a schematic side view of a plasma region and an activation region of a process chamber in accordance with at least some embodiments of the present disclosure.

FIG. 4 depicts a schematic side view of a plasma region 206 and an activation region 208 of a process chamber 200 in accordance with at least some embodiments of the present disclosure. In some embodiments, the plurality of first openings 224 have angled sidewalls 410 that form a conical cross-sectional shape to promote crossflow. In some embodiments, the plurality of second openings 312 may extend perpendicularly from the angled sidewalls 410 to promote crossflow. Crossflow of the first gas 340 and the second gas 350 delivered into the activation region 208 advantageously enhances mixing and creation of precursor radicals.

While the foregoing is directed to embodiments of the present disclosure, other and further embodiments of the disclosure may be devised without departing from the basic scope thereof.

The invention claimed is:

1. A method of depositing a metal silicide on a substrate having a silicon containing surface, comprising:

creating a plasma comprising a first gas in a plasma region in a chemical vapor deposition (CVD) chamber, wherein the plasma region is disposed vertically between a lid heater and a showerhead and extends horizontally between outer sidewalls of the showerhead;

flowing the first gas through a plurality of first openings of the showerhead to an activation region in the CVD chamber disposed between the showerhead and the substrate;

flowing a second gas comprising a metal precursor in a non-plasma state through a plurality of second openings of the showerhead to the activation region, wherein the plurality of second openings are fluidly independent from the plurality of first openings within the showerhead;

mixing the first gas with the second gas to activate the second gas in the activation region; and exposing the silicon containing surface of the substrate to the activated second gas.

2. The method of claim 1, wherein a pressure in the activation region is between about 2 to about 10 Torr.

3. The method of claim 1, further comprising maintaining the lid heater at a temperature of about 300 to about 600 degrees Celsius.

4. The method of claim 1, wherein the metal precursor comprises a metal halide.

5. The method of claim 1, wherein the first gas comprises one or more of a noble gas, nitrogen gas, hydrogen gas, or ammonia.

6. The method of claim 1, further comprising applying RF power to the lid heater or the showerhead to create an electric field in the plasma region.

7. The method of claim 6, wherein the electric field does not extend to the activation region.

8. The method of claim 1, further comprising a second showerhead disposed between the showerhead and the substrate, wherein the activation region is disposed between the showerhead and the second showerhead.

9. The method of claim 1, wherein the plurality of first openings have a conical cross-sectional shape to promote crossflow.

10. A method of depositing titanium silicide on a substrate, comprising:

creating a plasma comprising a first gas including a noble gas in a plasma region in a chemical vapor deposition (CVD) chamber, wherein the plasma region is disposed between a lid heater and a showerhead;

flowing the first gas through a plurality of first openings of the showerhead to an activation region in the CVD chamber disposed between the showerhead and the substrate;

flowing a second gas comprising a titanium precursor in a non-plasma state through a plurality of second openings of the showerhead to the activation region, wherein the plurality of second openings are fluidly independent from the plurality of first openings within the showerhead, wherein the plurality of first openings have angled sidewalls that form a conical cross-sectional shape and the plurality of second openings extend perpendicularly from the angled sidewalls;

mixing the first gas with the second gas to activate the second gas in the activation region to form radicals of the titanium precursor; and exposing a silicon surface of the substrate to the radicals of the titanium precursor to deposit titanium silicide on the substrate.

11. The method of claim 10, wherein the first gas further comprises hydrogen gas or nitrogen gas.

12. The method of claim 10, wherein the first gas creates a gas curtain that substantially prevents the titanium precursor from entering the plasma region.

13. The method of claim 10, further comprising applying RF power to the lid heater or the showerhead to create an electric field in the plasma region.

14. The method of claim 10, further comprising grounding a substrate support on which the substrate is disposed.

15. The method of claim 10, wherein the plasma is an inductively coupled plasma.

16. A method of depositing titanium silicide on a substrate, comprising:

applying RF power to a showerhead or lid heater in a chemical vapor deposition (CVD) chamber, flowing a first gas including argon gas and hydrogen gas in a plasma region disposed between the lid heater and the showerhead to form a plasma comprising the first gas, wherein the lid heater includes a heater plate coupled to a shaft, and wherein the heater plate includes a plurality of gas distribution openings for flowing the first gas to the plasma region;

flowing the first gas through a plurality of first openings of the showerhead to an activation region in the CVD chamber disposed between the showerhead and the substrate;

flowing a second gas comprising titanium tetrachloride $(TiCl_4)$ in a non-plasma state through a plurality of second openings of the showerhead to the activation region, wherein the plurality of second openings are fluidly independent from the plurality of first openings within the showerhead;

mixing the first gas with the second gas to activate the second gas in the activation region to form titanium trichloride $(TiCl_3)$ radicals, wherein a pressure in the activation region is between about 2 to about 10 Torr; and exposing the $TiCl_3$ radicals to the substrate to form titanium silicide on the substrate.

17. The method of claim 16, wherein a ratio of argon gas to hydrogen gas in the first gas is about 3.5 to about 4.5 by volume.

18. The method of claim 16, wherein the first gas is pulsed through the plurality of first openings.

19. The method of claim 16, wherein the second gas is not exposed to the plasma region.

20. The method of claim 16, wherein the RF power is about 600 to about 1000 watts.

\* \* \* \* \*